(12) United States Patent
Ho et al.

(10) Patent No.: US 7,239,573 B2
(45) Date of Patent: Jul. 3, 2007

(54) METHOD OF STORING DATA IN BLOCKS PER OPERATION

(75) Inventors: David Ho, Taipei (TW); Wei Yang, Shanghai (CN)

(73) Assignee: Inventec Appliances Corp., Taipei (TW)

( * ) Notice: Subject to any disclaimer, the term of this patent is extended or adjusted under 35 U.S.C. 154(b) by 260 days.

(21) Appl. No.: 11/111,729

(22) Filed: Apr. 22, 2005

(65) Prior Publication Data

US 2006/0136675 A1    Jun. 22, 2006

(30) Foreign Application Priority Data

Dec. 20, 2004   (TW) ............................ 93139602 A

(51) Int. Cl.
*G11C 8/00* (2006.01)

(52) U.S. Cl. ............................ 365/230.08; 365/230.09; 365/239

(58) Field of Classification Search .......... 365/230.03, 365/230.09, 239, 238.5, 230.01; 711/100–170
See application file for complete search history.

(56) References Cited

U.S. PATENT DOCUMENTS

| | | | | |
|---|---|---|---|---|
| 5,680,504 | A * | 10/1997 | Kopp | ............................ 704/201 |
| 7,124,271 | B2 * | 10/2006 | Li et al. | ...................... 711/170 |
| 2005/0259458 | A1 * | 11/2005 | Rustagi et al. | ................. 365/63 |
| 2006/0282609 | A1 * | 12/2006 | Jo | ............................... 711/103 |

* cited by examiner

*Primary Examiner*—Richard T. Elms
*Assistant Examiner*—Hien N Nguyen
(74) *Attorney, Agent, or Firm*—Bacon & Thomas, PLLC

(57) ABSTRACT

The present invention is to provide a method of storing data for driving an MMC or SD under an operating system (e.g., Linux), which comprises the steps of collecting data in a plurality of discreet blocks of a high-speed buffer for each writing request made by a device driver under the OS; temporarily storing data in a plurality of continuous blocks of another buffer; and writing data from the continuous blocks of another buffer into a continuous block of the MMC or the SD in one operation in the form of multiple blocks in due time. By utilizing this method, data writing speed is significantly increased.

3 Claims, 1 Drawing Sheet

METHOD OF STORING DATA IN BLOCKS PER OPERATION

FIELD OF THE INVENTION

The present invention relates to data storing, more particularly to a method of storing data in the form of multiple blocks per operation in driving an MMC or SD under an operating system (e.g., Linux), enabling data to be read from the MMC or SD in a form of single block and to be written into the MMC or SD in a form of multiple blocks and significantly increasing data accessing speed.

BACKGROUND OF THE INVENTION

Life and work have become busy as economy develops rapidly in recent decades. Information exchange among people also becomes often. A wide variety of portable electronic products (e.g., digital cameras, PDAs (personal digital assistants)) and mobile communication products are commercially available as electronics and communication industries advance. The fast development of such new products not only brings a lot of convenience but also is closely associated with our daily life and work. Thus, it is impossible of doing without them. Moreover, such products are provided with many advanced and ergonomic features meeting the needs of consumers.

Conventionally, these electronic products are equipped with high-capacity memory for storing ever increasing data in operation. Typically, a low-capacity memory is provided in the electronic products due to factors such as cost and space. The low-capacity memory is fast to access but its cost is relatively expensive. Thus, a type of inexpensive high-capacity memory (e.g., MMC (Multi-Media Card) or SD (Secure Digital)) is employed as auxiliary storage (i.e., expansion memory) of the electronic products.

Currently, Microsoft's Windows and Linux are two most popular operating systems (OSs) throughout the world. Most people are familiar with Windows. This is because more than 90% of PCs (personal computers) in the world are installed with Windows. Both Linux and Windows are designed to run on PCs. Linux was developed by Linus Torvalds and others in 1990. Linux is derived from UNIX and is highly compatible therewith. Linux has different kernels and file systems. Copies (i.e., source codes) of Linux are given away free. Thus, many applications, drivers, utilities, and free software are developed from Linux operating system and they are given free of charge to others. MMC and SD are also supported (i.e., driven) by Linux and thus reading or writing operation can be performed on them by running Linux.

However, reading or writing operation performed on MMC or SD is done by a single data block rather than a plurality of data blocks per unit time due to limitation of Linux kernels and other technological reasons. As such, reading speed in Linux kernels is faster but writing speed is much lower. This in turn causes inconvenience in using MMC or SD.

Following is a detailed description of drivers under Linux. The drivers are comprised of a character device, a block device, and a network device. Each of MMC and SD is the block device. Referring to FIG. 1, there is shown a simplified diagram of writing data into MMC or SD under Linux. Data to be written is placed on a plurality of discreet blocks 10 of a high-speed buffer under Linux. Data in the blocks 10 is moved to a continuous data 11 of MMC or SD (as indicated by arrows in FIG. 1) step by step in a writing operation. Data in the blocks 10 is moved to a writing card (e.g., loading card) as a whole (i.e., synchronous) only in a writing operation of the card. This is also called "sync" operation.

In a "sync" operation, a data block is requested in every writing operation under Linux. The size of a data block is 1024B for MMC or SD.

Device parameters of MMC or SD are configured before data writing. Next, the device is activated to position tracks. Data begins to transfer from the blocks to a target area. The device is disabled after completing the data transfer.

It is found from the above test that time spent in transferring data is much less than a sum of time spent in activation, track positioning, and deactivation. In other words, much time is spent on preparation rather than data transfer which only occupies a very small percentage of the whole time. This is the reason why data writing speed is very slow.

The inventor is aware of the above problem and is dedicated to meet market needs. The inventor thus spends a lot of time to research Linux kernels in order to improve speed of writing data into MMC or SD and thus facilitate the use of MMC or SD.

SUMMARY OF THE INVENTION

After considerable research and experimentation, a method of storing data in blocks per operation according to the present invention has been devised so as to overcome the above drawback of the prior art. The drawback is detailed below. Reading or writing operation performed on MMC or SD is done by a single data block rather than a plurality of data blocks per unit time due to limitation of Linux kernels and other technological reasons. As such, reading speed in Linux kernels is faster but writing speed is much lower. This in turn causes inconvenience in using MMC or SD.

It is an object of the present invention to provide a method of storing data for driving an MMC or SD under an operating system (e.g., Linux), comprising the steps of for each writing request made by a device driver under the OS collecting data in a plurality of discreet blocks of a high-speed buffer; temporarily storing data in a plurality of continuous blocks of another buffer; and writing data from the continuous blocks of another buffer into a continuous block of the MMC or the SD in one operation in the form of multiple blocks in due time. By utilizing this method, data writing speed is significantly increased, using MMC or SD is made easy, and the prior problem is completely solved.

It is another object of the present invention to provide a method of storing data in blocks per operation. By utilizing this method, a number of advantages are obtained as follows.

(1) For each writing request made by a device driver under an operating system (e.g., Linux) the method performs collecting data in a plurality of discreet blocks of a high-speed buffer to be written into a continuous block of the MMC or the SD; temporarily storing data in a plurality of continuous blocks of another buffer; and writing data from the continuous blocks of another buffer into a continuous block of the MMC or the SD in one operation in the form of multiple blocks in due time.

(2) For each writing request made by a device driver under the operating system (e.g., Linux), data in a single block is written in the form of one block per operation and data in multiple blocks is written in the form of multiple blocks per operation.

(3) For each reading request made by a device driver under the operating system (e.g., Linux), data in a single block is read in the form of one block per operation.

The above and other objects, features and advantages of the present invention will become apparent from the following detailed description taken with the accompanying drawings.

DETAILED DESCRIPTION OF THE PREFERRED EMBODIMENTS

Figure 1:
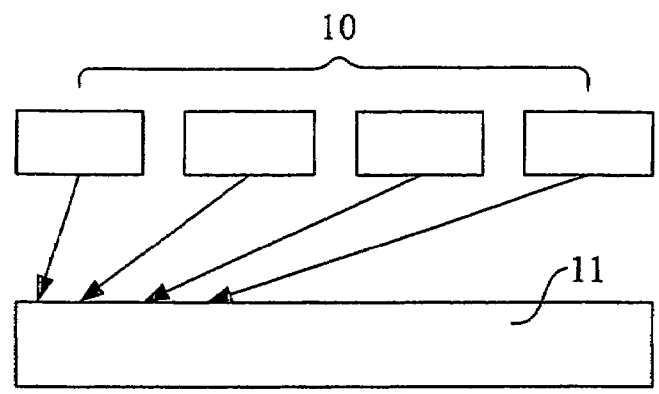
FIG. 1 is a simplified diagram of writing data into MMC or SD under Linux according to prior art.

As shown in a simplified diagram of FIG. 1, data is written into MMC or SD under Linux in which data to be written is placed on a plurality of discreet blocks 10 of a high-speed buffer, data in the blocks 10 is moved to a continuous data 11 of MMC or SD (as indicated by arrows in FIG. 1) step by step in a writing operation, and data in the blocks 10 is moved to a writing card (e.g., loading card) as a whole only in a writing operation of the card (i.e., called "sync" operation). In the "sync" operation, factors such as device parameters of MMC or SD, time spent in transferring data is much less than a sum of time spent in activation, track positioning, and deactivation, or the like all contribute in the slowing of data writing operation. These have been fully described in the background. Accordingly, further description. is omitted for purpose of brevity.

Figure 2:
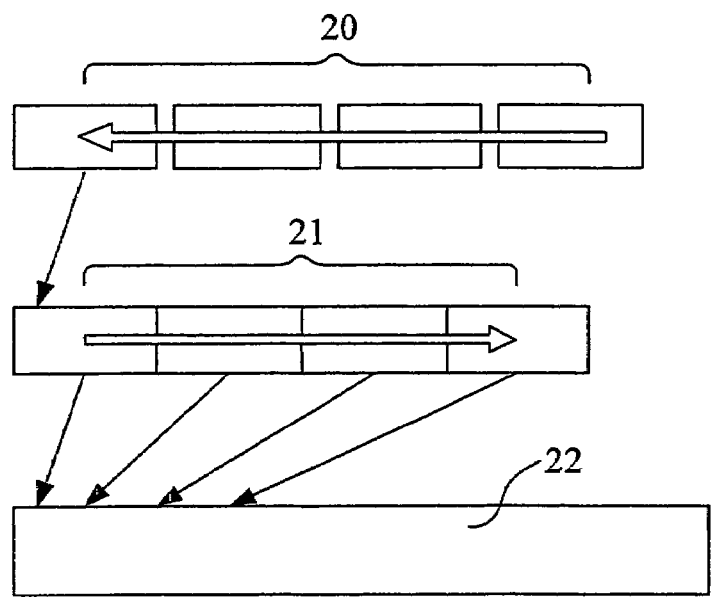
FIG. 2 is a simplified diagram of writing data into MMC or SD under Linux according to the invention.

Referring to FIG. 2, there is shown a method of storing data in the form of multiple blocks per operation according to the invention as a solution of the prior problem. The method is performed for driving MMC or SD under a predetermined operating system (e.g., Linux). For each writing request made by a device driver under Linux (as indicated by arrows in FIG. 2), data in a plurality of discreet blocks 20 of a high-speed buffer is collected. Next, the collected data is temporarily stored in a plurality of continuous blocks 21 of another buffer. Next, write data from the continuous blocks 21 of another buffer into a continuous block 22 of MMC/SD in- one operation in the form of multiple blocks (as indicated by arrows in FIG. 2) in due time (e.g., the continuous blocks 21 of another buffer are full of data). That is, all data is written into the continuous block 22 at one time. As such, time spent in data transfer (i.e., data writing) may occupy a large percentage of the whole time including the data writing operation. As a result, data writing speed is significantly increased.

In the invention the purpose of collecting data in the discreet blocks 20 of the high-speed buffer is that a pointer is associated with each discreet block 20 of the high-speed buffer under the operating system (e.g., Linux). Address in MMC/SD associated with data to be written from each block 20 is indicated by the pointer. Thus, data to be written in the continuous block 22 of MMC/SD can be obtained by linking the pointers.

Moreover, in a "sync" operation, a data block is requested in every writing operation under the operating system (e.g., Linux). Fortunately, data in a plurality of discreet blocks 20 of a high-speed buffer is collected. Next, the collected data is temporarily stored in a plurality of continuous blocks 21 of another buffer. Next, write whole data from the continuous blocks 21 of another buffer into a continuous block 22 of MMC/SD in one operation in the form of multiple blocks.

A plurality of continuous blocks 21 are taken as operating parameters in writing data into MMC/SD in the form of multiple blocks. But data in a the blocks 20 of the high-speed buffer are discreet. Hence, a plurality of continuous blocks 21 of another buffer are employed as a temporary storage and are served as means for transferring the parameters to the writing operation in the form of multiple blocks as contrived by the invention.

Following is an example for illustrating principles of the invention. A plurality of labeled bricks are randomly arranged in place B. These bricks are to be carried to a plurality of ordered blocks in place B for storage. There are two possible scenarios. A first scenario is that bricks are carried from place A to corresponding blocks in place B one by one. Of course, all bricks can be carried to their destinations after a number of movements. But its speed is very slow.

A second scenario is that bring all bricks in place A to a truck. Next, drive the truck to place B and unload the bricks and store same in place B in order. The second scenario is able to carry all bricks to their destinations in a short period of time.

The first scenario is similar to write data in the form of one block per operation (i.e., the prior art). The second scenario is similar to write data in the form of multiple blocks per operation (i.e., the invention). It is clear that data writing speed can is significantly increased by the method of writing data in the form of multiple blocks per operation as contemplated by the invention.

While the invention herein disclosed has been described by means of specific embodiments, numerous modifications and variations could be made thereto by those skilled in the art without departing from the scope and spirit of the invention set forth in the claims.

What is claimed is:

1. A method of storing data for driving an MMC or SD under an operating system (OS), comprising the steps of:
    for each writing request made by a device driver under the OS, collecting data in a plurality of discreet blocks of a high-speed buffer to be written into a continuous block of the MMC or the SD;
    temporarily storing data in a plurality of continuous blocks of another buffer; and
    writing data from the continuous blocks of another buffer into a continuous block of the MMC or the SD in one operation in the form of multiple blocks.

2. The method of claim 1, wherein collecting data in the discreet blocks of the high-speed buffer is done by employing a pointer associated with each discreet block of the high-speed buffer under the OS, causing the pointer to indicate an address in the MMC or the SD associated with data to be written from each block of the high-speed buffer, and obtaining data to be written in the continuous block of the MMC or the SD by linking the pointers.

3. The method of claim 1, wherein the due time occurs when the continuous blocks of another buffer are full of data.

* * * * *